(12) United States Patent
Giorgetta et al.

(10) Patent No.: US 6,892,151 B1
(45) Date of Patent: May 10, 2005

(54) METHODS AND APPARATUS FOR DETERMINING WHETHER ELECTRONIC DEVICES ARE COMMUNICATIVELY COMPATIBLE

(75) Inventors: Timothy E. Giorgetta, San Diego, CA (US); Madjid Hamidi, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 235 days.

(21) Appl. No.: 09/957,162

(22) Filed: Sep. 19, 2001

(51) Int. Cl.[7] .............................................. G06F 29/00
(52) U.S. Cl. ............................. 702/71; 702/64; 702/65
(58) Field of Search .............................. 702/57–80, 50; 709/224, 228, 203, 222; 710/106; 703/27; 379/29.08; 325/224–228; 324/765, 606, 600

(56) References Cited

U.S. PATENT DOCUMENTS

| | | | |
|---|---|---|---|
| 5,022,028 A | | 6/1991 | Edmonds et al. |
| 5,497,460 A | | 3/1996 | Bailey et al. |
| 5,894,230 A | * | 4/1999 | Voldman ..................... 326/86 |
| 5,965,997 A | * | 10/1999 | Alwardi et al. ............. 320/132 |
| 6,047,389 A | | 4/2000 | Thai |
| 6,094,063 A | * | 7/2000 | St. Pierre et al. ............. 326/37 |
| 6,095,674 A | | 8/2000 | Verissimo et al. |
| 6,134,674 A | | 10/2000 | Akasheh |
| 6,233,719 B1 | | 5/2001 | Hardikar et al. |
| 6,263,484 B1 | | 7/2001 | Yang |
| 6,420,924 B1 | * | 7/2002 | Lundberg .................... 327/333 |
| 6,432,731 B1 | * | 8/2002 | Kuroiwa ........................ 438/14 |
| 6,439,464 B1 | * | 8/2002 | Fruhauf et al. .............. 235/492 |
| 6,501,308 B2 | * | 12/2002 | Bakker et al. ............... 327/156 |
| 6,549,150 B1 | * | 4/2003 | Bulaga et al. ............... 341/120 |
| 6,629,048 B1 | * | 9/2003 | Law et al. ..................... 702/64 |

OTHER PUBLICATIONS

Bordeaux et al. "Low Voltage Interfaces", 2000, http://www.analog.com/Analog_Root/static/pdf/dataConverters/MixedSignal_Sect10.pdf.*

* cited by examiner

Primary Examiner—Marc S. Hoff
Assistant Examiner—Anthony Gutierrez
(74) Attorney, Agent, or Firm—Incaplaw; Terrance A. Meador

(57) ABSTRACT

A computer-implemented method of quickly determining whether two or more electronic devices are communicatively compatible is described. The method includes reading a plurality of input parameter data associated with a first electronic device and a plurality of output parameter data associated with a second electronic device; analyzing the pluralities of input and output parameter data by determining whether they comply with a plurality of communication compatibility rules; generating results from the analysis; and providing a visual display of the results. The results identify which input and output parameter data do and do not comply with these rules, and thus whether and to what extent the devices are communicatively compatible. As one example, the input parameter data of the first electronic device may include a maximum high input voltage $V_{IHmax}$, a minimum high input voltage $V_{IHmin}$, a maximum low input voltage $V_{ILmax}$, and a minimum low input voltage $V_{ILmin}$; and the output parameter data of the second electronic device may include a maximum high output voltage $V_{OHmax}$, a minimum high output voltage $V_{OHmin}$, a maximum low output voltage $V_{OLmax}$, and a minimum low output voltage $V_{OLmin}$. In this case the communication compatibility rules specify that $V_{OHmax} \leq V_{IHmax}$, $V_{OHmax} \geq V_{IHmin}$, $V_{OLmax} \leq V_{ILmax}$, and $V_{OLmin} \geq V_{ILmin}$ for device compatibility.

36 Claims, 7 Drawing Sheets

METHODS AND APPARATUS FOR DETERMINING WHETHER ELECTRONIC DEVICES ARE COMMUNICATIVELY COMPATIBLE

BACKGROUND OF THE INVENTION

1. Field of the Invention

The present invention relates generally to methods of determining whether electronic devices are compatible with each other, and more particularly to PC or server-based software which determines whether such electronic devices are communicatively compatible for a circuit or system design.

2. Description of the Related Art

Any one of a large number of electronic devices, such as logic gates, communication transceivers, routers, etc., may be considered for use in a circuit or system design. For the communication of data, such a device typically has data and clock inputs which may be coupled to data and clock outputs, respectively, of another electronic device. Although most electronic devices can be connected in some manner, one significant factor in the success of a design depends on whether the electronic devices are communicatively compatible such that data can be reliably communicated therebetween.

Electronic devices may or may not be compatible because each device is designed and configured in accordance with any one of a number of different standards and/or specifications, whether open or proprietary. These standards and specs may or may not be compatible with one other. If the devices are off-the-shelf incompatible, they may still be employed in a design with the use of external interface circuitry. A design having interface circuitry, however, may not be appropriate from a cost or practical standpoint depending on the significance of the underlying differences between the devices.

As apparent, much wasted time and money may be expended to figure out whether two or more electronic devices are communicatively compatible. The "time to market" a circuit or system is typically a significant factor in the overall success of the circuit or system. Accordingly, there is a resulting need for a low-cost method of quickly determining whether two or more electronic devices are communicatively compatible.

SUMMARY OF THE INVENTION

According to the present invention, a computer-implemented method of determining whether two or more electronic devices are communicatively compatible is advantageously provided. The method includes reading a plurality of input parameter data associated with a first electronic device and a plurality of output parameter data associated with a second electronic device; analyzing the pluralities of input and output parameter data by determining whether they comply with a plurality of communication compatibility rules; generating results from the analysis; and providing a visual display of the results. The displayed results identify which input and output parameter data do and do not comply with these rules, and thus whether and to what extent the devices are communicatively compatible. As apparent, the method is a useful aid for quickly selecting and configuring electronic devices within a circuit or system design.

The input and output parameter data may be or include any suitable communication specification data associated with the electronic devices. For further illustration, described herein are a number of basic requirements for communication compatibility with their associated sets of input and output parameter data.

One basic compatibility requirement relates to minimum and maximum voltage levels of the devices. Here, the input parameter data of the first electronic device include a maximum high input voltage $V_{IHmax}$, a minimum high input voltage $V_{IHmin}$, a maximum low input voltage $V_{ILmax}$, and a minimum low input voltage $V_{ILmin}$; and the output parameter data of the second electronic device include a maximum high output voltage $V_{OHmax}$, a minimum high output voltage $V_{OHmin}$, a maximum low output voltage $V_{OLmax}$, and a minimum low output voltage $V_{OLmin}$. In this case, one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for device compatibility.

Another fundamental compatibility requirement relates to setup and hold times of the devices. Here, the input parameter data of the first electronic device include an input setup time $T_{INsetup}$ and an input hold time $T_{INhold}$, and the output parameter data of the second electronic device include an output setup time $T_{OUTsetup}$ and an output hold time $T_{OUThold}$. In this case, the communication compatibility rules specify that $T_{OUTsetup} > T_{INsetup}$ and $T_{OUThold} > T_{INhold}$ for device compatibility.

A further compatibility requirement relates to clock rise and fall times of the devices. Here, the input parameter data of the first electronic device include an input rise time $T_{INrise}$ and an input fall time $T_{INfall}$, the output parameter data of the second electronic device an output rise time $T_{OUTrise}$ and an output fall time $T_{OUTfall}$. In this case, the communication compatibility rules specify that $T_{OUTrise} < T_{INrise}$ and $T_{OUTfall} < T_{INfall}$ for device compatibility.

Yet another compatibility requirement relates to clock duty cycles of the devices. Here, the input parameter data of the first electronic device include an input clock duty cycle and the output parameter data of the second electronic device include an output clock duty cycle. In this case, the communication compatibility rules specify that the input clock duty cycle be closer to a 0/100 duty cycle than the output clock duty cycle, and the output clock duty cycle be closer to a 50/50 duty cycle than the input clock duty cycle.

The last communication compatibility requirement relates to common mode voltage levels of the devices. Here, the input parameter data of the first electronic device include a maximum differential input voltage $V_{INmaxdiff}$ and a minimum differential input voltage $V_{INmindiff}$, and the output parameter data of the second electronic device include a maximum differential output voltage $V_{OUTmaxdiff}$ and a minimum differential input voltage $V_{OUTmindiff}$. In this case, the communication compatibility rules specify that $V_{OUTmaxdiff} < V_{INmaxdiff}$ and $V_{OUTmindiff} > V_{INmindiff}$ for device compatibility.

As the inventive computer method quickly identifies which input and output parameter data of the electronic devices do and do not comply with communication compatibility rules, and thus whether and to what extent the devices are communicatively compatible, it serves as a low-cost useful aid for quickly selecting and configuring such devices in a circuit or system design.

DETAILED DESCRIPTION OF THE PREFERRED EMBODIMENTS

According to the present invention, a computer-implemented method for quickly determining whether two or more electronic devices are communicatively compatible is advantageously provided. The method includes reading a plurality of input parameter data associated with a first electronic device and a plurality of output parameter data associated with a second electronic device; analyzing the pluralities of input and output parameter data by determining whether they comply with a plurality of communication compatibility rules; generating results from the analysis; and providing a visual display of the results. The displayed results identify which input and output parameter data do and do not comply with these rules, and thus whether and to what extent the devices are communicatively compatible. As apparent, the computer method is a useful aid for quickly selecting and configuring electronic devices in a circuit or system design.

Figure 1:
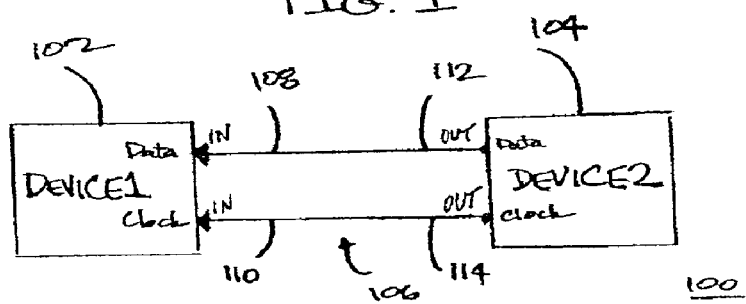
FIG. 1 is a block diagram of two electronic devices to be analyzed for compatibility.

FIG. 1 is a block diagram of two electronic devices 102 and 104 which will be analyzed for compatibility in accordance with the present invention. Each one of devices 102 and 104 may be any type of electronic device having an interface for communicating with another electronic device. For example, the electronic device may be a logic gate, a transceiver, a router, a hub, a microprocessor, a memory device, etc. Electronic devices 102 and 104 are considered for use in a design 100 where they would ultimately be coupled together via conductors 106 for data communication. More particularly, electronic device 102 has a data input 108 which may be connected to a data output 112 of electronic device 104. In addition, electronic device 102 has a clock input 110 which may be connected to a clock output 114 of electronic device 104. Although for simplicity electronic devices 102 and 104 are described to provide data communication in a single direction (from electronic device 104 to electronic device 102), it is understood that bi-directional data communication is possible if not more likely to be considered in the analysis.

Although most any two electronic devices can be connected in some way, the success of any design depends in part on whether the electronic devices are communicatively compatible such that reliable data communication can take place therebetween. Electronic devices may or may not be compatible since each device is designed and configured in accordance with any one of a number of different standards and specifications, whether open or proprietary. These standards and specs may or may not be compatible with one other. Examples of standards and specifications for such devices include Positive Emitter Coupled Logic (PECL), Low-Voltage Positive Emitter Coupled Logic (LVPECL), Low-Voltage Differential Signaling (LVDS), Current Mode Logic (CML), High Speed Transceiver Logic (HSTL), Transistor-Transistor Logic (TTL), and Low-Voltage Transistor-Transistor Logic (LVTTL). If not "off-the-shelf" incompatible, the electronic devices may still be employed in a design using interface circuitry between the devices. However, even a design with interface circuitry may or may not be economically or practically viable depending on the significance of the underlying differences between the devices.

Figure 5:
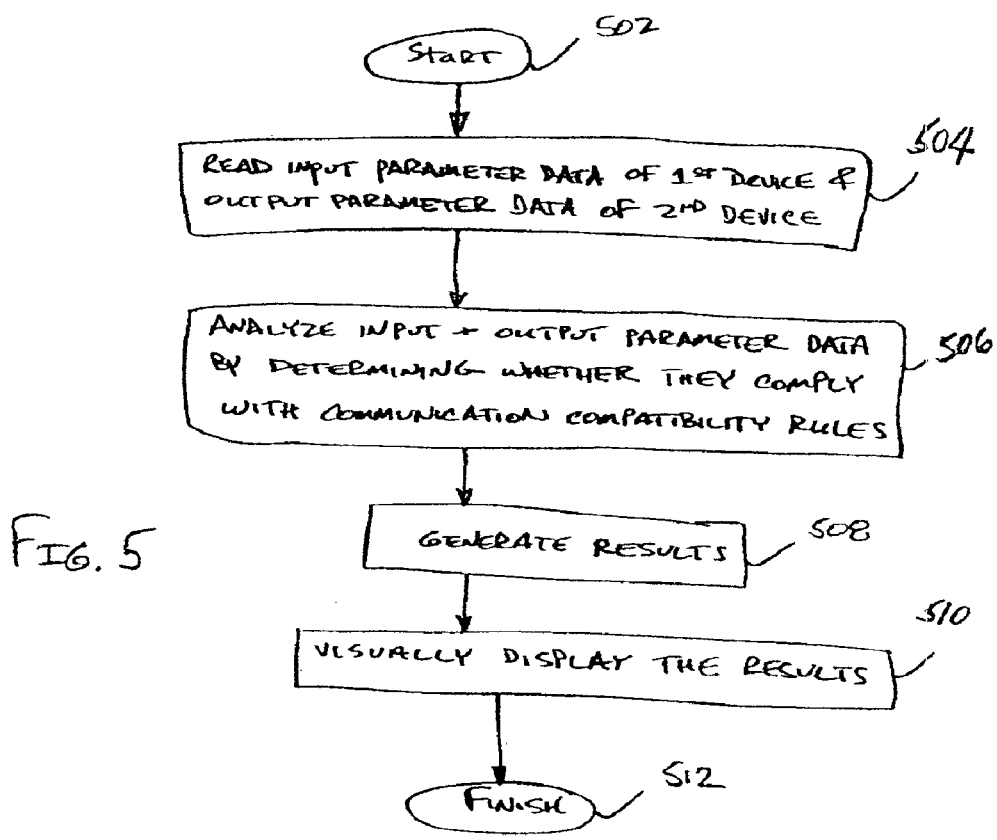
FIG. 5 is a flowchart describing a general software method of determining whether the two electronic devices of FIG. 1 are communicatively compatible.

Referring ahead to FIG. 5, a flowchart describing a method of determining whether electronic devices 102 and 104 of FIG. 1 are communicatively compatible is shown. The methods described herein may be embodied and implemented with computer software in connection with conventional computer software components. The inventive computer software may be embedded in or stored on a disk or memory, and executable by a computer or a processor. The computer may be, for example, a personal computer (PC) or a server computer accessible over a local area network (LAN) or wide area network (WAN) such as the Internet. Thus, the inventive features may exist in a signal-bearing medium which embodies a program of machine-readable instructions executable by a computer or processing apparatus which performs these methods.

Reference will be made to FIGS. 1 and 5 in combination. Beginning at a start block 502 of FIG. 5, input parameter data of electronic device 102 and output parameter data of electronic device 104 are read by the computer software (step 504). The input and output parameter data may be entered into the computer by an end-user via a computer keyboard, or from a prestored file in computer memory, which is selected by the end-user. Next, the input and output parameter data are analyzed by the computer software where it is determined whether the data comply with a set of communication compatibility rules (step 506). Results are generated based on this analysis (step 508). Preferably, the results are displayed on a monitor of the computer or via a hardcopy printout (step 510). The results may also be stored for later review or use. The flowchart ends at a finish block 512 of FIG. 5.

The input and output parameter data may be or include any suitable communication specification data associated with the devices. One basic compatibility requirement relates to minimum and maximum voltage levels of the devices. Referring back to FIG. 2, a signal diagram 200 showing digital logic voltage levels of an electronic device is shown. A signal 202 of the electronic device may either have a high ('1') state 204 or a low ('0') state 206 at any given time. During its high state 204, signal 202 has a high nominal voltage level 220. This high nominal voltage level 220 varies during operation of the device as well as from device to device. Signal 202 therefore has a maximum high voltage level 208 and a minimum high voltage level 210 associated with it. Similarly, during its low state 206, signal 202 has a low nominal voltage level 222. This low nominal voltage level 222 also varies during operation of the device as well as from device to device. Signal 202 therefore has a maximum low voltage level 212 and a minimum low voltage level 214 associate with it.

Figure 3:
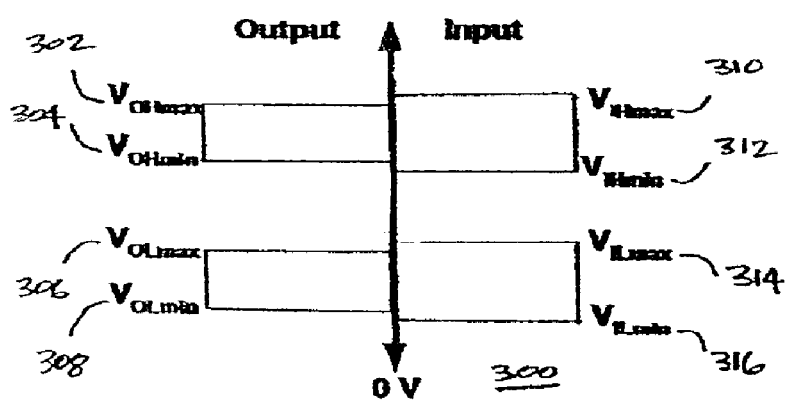
FIG. 3 is a voltage compatibility requirement diagram for the input and output voltage levels.

Continuing on with the discussion, FIG. 3 shows a voltage compatibility requirement diagram 300 for logic voltage levels of electronic devices 102 and 104 of FIG. 1. Input parameter data of electronic device 102 of FIG. 1 include a maximum high input voltage $V_{IHmax}$ requirement 310, a minimum high input voltage $V_{IHmin}$ requirement 312, a maximum low input voltage $V_{ILmax}$ requirement 314, and a minimum low input voltage $V_{ILmin}$ requirement 316. Output parameter data of electronic device 104 of FIG. 1 include a maximum high output voltage $V_{OHmax}$ requirement 302, a minimum high output voltage $V_{OHmin}$ requirement 304, a maximum low output voltage $V_{OLmax}$ requirement 306, and a minimum low output voltage $V_{OLmin}$ requirement 308. For compatibility, $V_{OHmax} \leq V_{IHmax}$, $V_{OHmin} \geq V_{IHmin}$, $V_{OLmax} \leq V_{ILmax}$, and $V_{OLmin} \geq V_{ILmin}$, as illustrated in FIG. 3. These required relationships, which are also illustrated in FIG. 4, form communication compatibility rules for the voltage level specifications associated with the devices.

Figure 2:
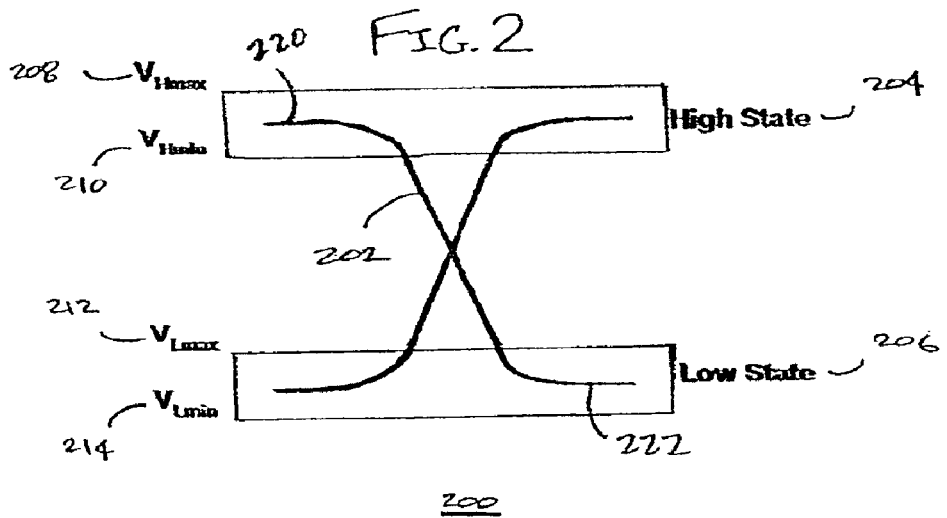
FIG. 2 is a signal diagram showing logic voltage levels of the two electronic devices of FIG. 1.
Figure 4:
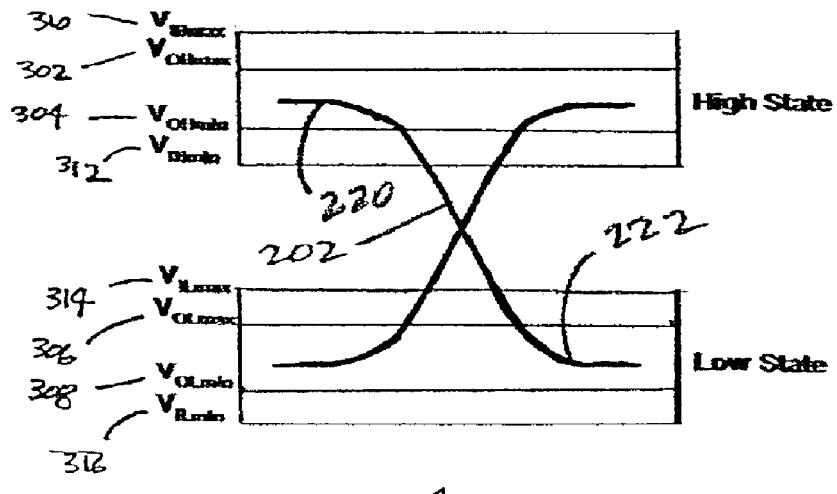
FIG. 4 is another representation of the voltage compatibility requirement diagram of FIG. 3.
Figure 6:
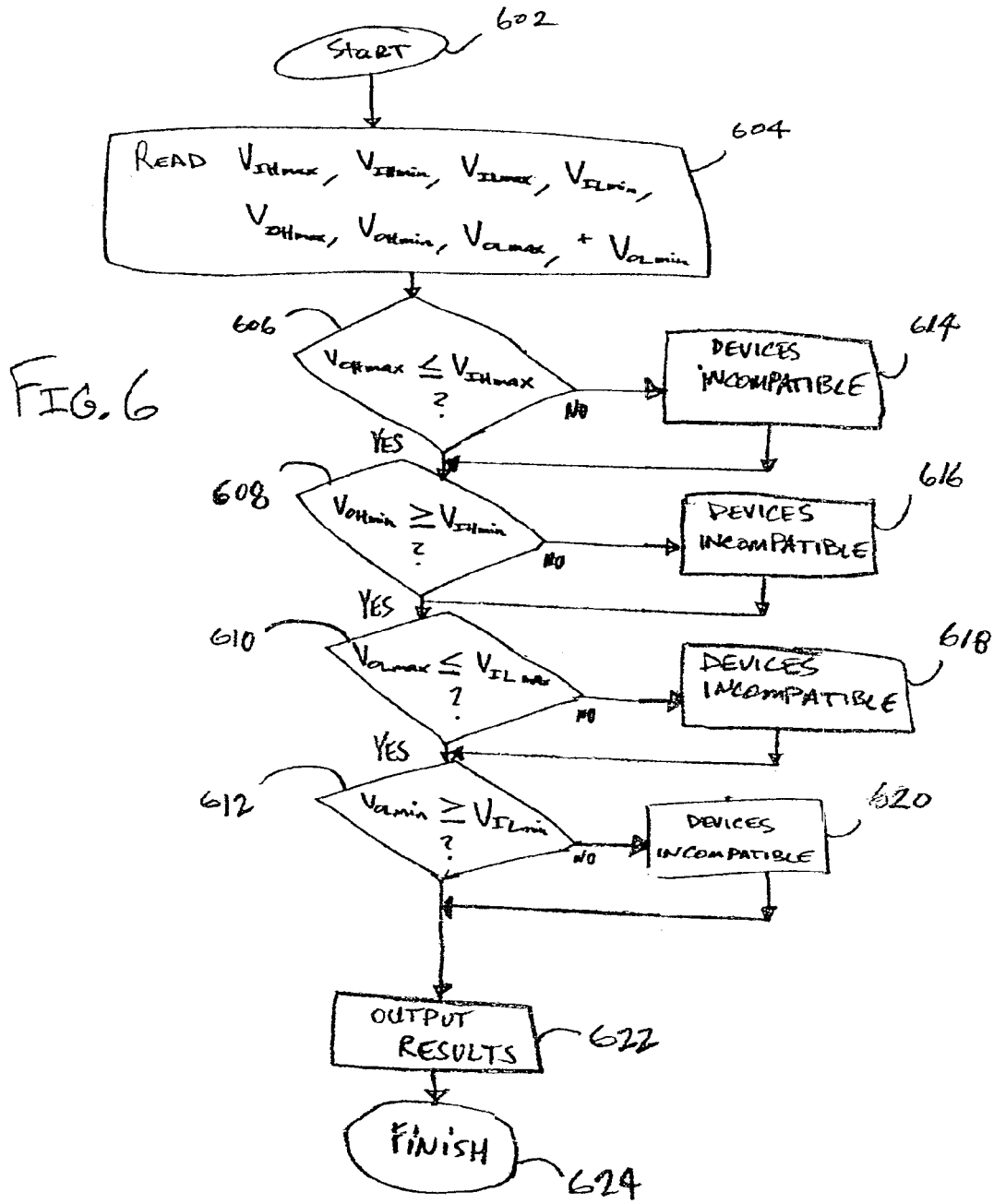
FIG. 6 is a flowchart describing a software method of determining whether the two electronic devices of FIG. 1 are communicatively compatible only with respect to the input and output voltage levels described in relation to FIGS. 2–4.

FIG. 6 is a flowchart describing a method of determining whether electronic devices 102 and 104 of FIG. 1 are communicatively compatible with respect to the voltage levels described in relation to FIGS. 2–4. Beginning at a start block 602, input parameter data of electronic device 102 including maximum high input voltage $V_{IHmax}$, minimum high input voltage $V_{IHmin}$, maximum low input voltage $V_{ILmax}$, and minimum low input voltage $V_{ILmin}$, as well as output parameter data of electronic device 104 including maximum high output voltage $V_{OHmax}$, minimum high output voltage $V_{OHmin}$, maximum low output voltage $V_{OLmax}$, and minimum low output voltage $V_{OLmin}$, are read by the computer software (step 604). For example, this input and output parameter data may be entered into input data fields by an end-user or selected from a pre-stored file in computer memory.

Next, the input and output parameter data are analyzed using communication compatibility rules (steps 602–612). More particularly, the data is tested to identify whether $V_{OHmax} \leq V_{IHmax}$ (step 606), $V_{OHmin} \geq V_{IHmin}$ (step 608), $V_{OLmax} \leq V_{ILmax}$ (step 610), and $V_{OLmin} \geq V_{ILmin}$ (step 612). If any one of the specifications in steps 606–612 is not met, the interface is marked as incompatible in that particular regard (steps 614–620). If all of the specifications are met, the devices are deemed "off-the-shelf" compatible. Results are generated and outputted (step 622). For example, the results may be visually displayed on a monitor, printed, and/or stored for later review or use.

The results provide an indication of whether the devices are communicatively compatible. These results may be conclusory or factual in nature, or both. For example, the results may indicate simply that the devices are compatible or incompatible. They may also identify to what extent the devices are compatible and/or incompatible. The results may particularly specify which requirements are met and/or not met.

The results may also provide an indication of the significance or insignificance of any unmet requirement. For example, some unmet requirements may be critical for interfacing the devices, and the results may identify this criticality. In this case, the circuit or system designer may choose to no longer consider the two particular devices in the intended design. On the other hand, some unmet requirements may be less critical for interfacing the devices, and the results may specify this non-critical nature. In this case, the circuit or system designer may continue to consider the two particular devices for the design. One or more visual or textual suggestions for interfacing circuitry may be provided as part of the output for any non-critical unmet requirements. Thus, although perhaps identified as incompatible in the displayed results, the electronic devices may be identified as compatible when associated with interface circuitry.

Figure 7:
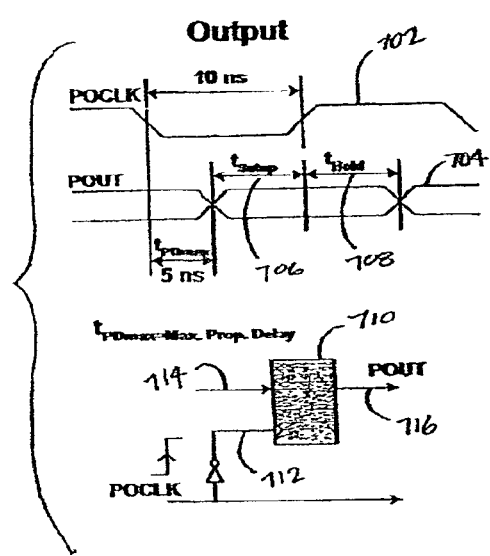
FIG. 7 illustrates output signals of one of the electronic devices of FIG. 1 with particular setup and hold time requirements.
Figure 8:
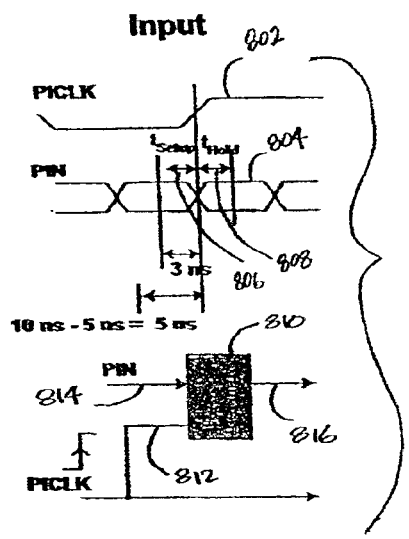
FIG. 8 illustrates input signals of one of the electronic devices of FIG. 1 with particular setup and hold time requirements.

Other input and output parameter data, in addition to the minimum and maximum voltage levels, may be read and analyzed as well. For example, another fundamental compatibility requirement relates to setup and hold times of the devices. To illustrate, FIG. 8 shows input signal requirements of electronic device 102 having particular setup and hold time requirements. More particularly, clock input signal 802 and a data input signal requirement 804 for communicating data to electronic device 102 are shown. The signals are typically received with a latch 810 having a clock input 812, a data input 814, and an output 816. Data input signal requirement 804 shows an output setup time $T_{OUTsetup}$ requirement 806 and an output hold time $T_{OUThold}$ requirement 808 for proper communication. On the other hand, FIG. 7 shows an output signal requirement of electronic device 104 of FIG. 1 with particular setup and hold time requirements. More particularly, a clock output signal 702 and a data output signal requirement 704 for properly communicating data from electronic device 102 are shown. The signals are typically generated from a flip-flop 710 having a clock input 712, a data input 714, and an output 716. Data output signal requirement 704 has an input setup time $T_{INsetup}$ requirement 706 and an input hold time $T_{INhold}$ requirement 708 for proper communication. For this particular input and output parameter data, the communication compatibility rules specify that $T_{OUTsetup} > T_{INsetup}$ and $T_{OUThold} > T_{INhold}$ for device compatibility.

Figure 9:
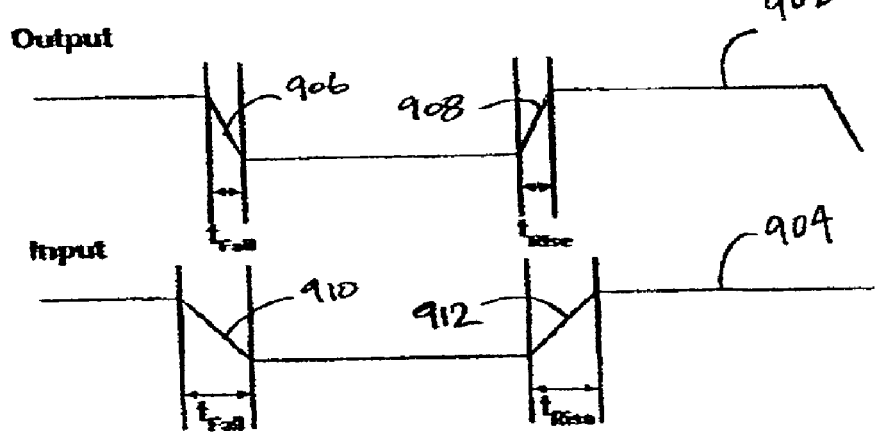
FIG. 9 illustrates output and input signals of the electronic devices of FIG. 1 with particular rise and fall time requirements.

A further compatibility requirement relates to clock rise and fall times of the electronic devices. To illustrate, FIG. 9 shows output and input signal requirements of electronic devices 102 and 104 of FIG. 1 having particular rise and fall time requirements. More particularly, an input signal requirement 904 of electronic device 102 shows an input fall time $T_{INfall}$ requirement 910 and an input rise time $T_{INrise}$ requirement 912. Similarly, an output signal requirement 902 of electronic device 104 shows an output rise time $T_{OUTrise}$ requirement 908 and an output fall time $T_{OUTfall}$ requirement 906. For this particular input and output parameter data, the communication compatibility rules specify that $T_{OUTrise} < T_{INrise}$ and $T_{OUTfall} < T_{INfall}$ for device compatibility.

Figure 10:
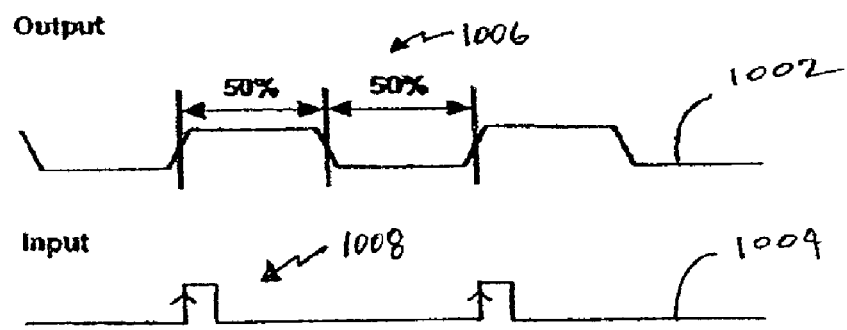
FIG. 10 illustrates output and input clock signals of the electronic devices of FIG. 1 with particularly clock duty cycle requirements.

Yet another compatibility requirement relates to clock duty cycles of the electronic devices. To illustrate, FIG. 10 shows output and input clock signal requirements of electronic devices 102 and 104 having particular clock duty cycle requirements. More particularly, an input signal requirement 1004 of electronic device 102 has an input clock duty cycle requirement 1008, and an output signal requirement 1002 of electronic device 104 has an output clock duty cycle requirement 1006. For this particular input and output parameter data, the communication compatibility rules specify that the input clock duty cycle requirement 1008 be closer to a 0/100 duty cycle than the output clock duty cycle requirement 1006, and the output clock duty cycle requirement 1006 be closer to a 50/50 duty cycle than the input clock duty cycle requirement 1008.

Figure 11:
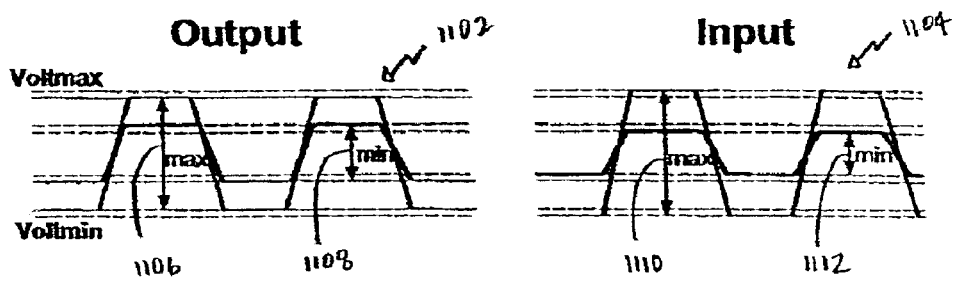
FIG. 11 illustrates output and input signals of the electronic devices of FIG. 1 with particular differential voltage level requirements.

The last communication compatibility requirement described herein relates to common mode voltages of the electronic devices. To illustrate, FIG. 11 shows output and input signals of electronic devices 102 and 104 of FIG. 1 having particular minimum and maximum differential voltage level requirements. More particularly, an input signal requirement 1104 of electronic device 102 has a maximum differential input voltage $V_{INmaxdiff}$ requirement 1110 and a minimum differential input voltage $V_{INmindiff}$ requirement 1112. An output signal requirement 1102 of electronic device 104 has a maximum differential output voltage $V_{OUTmaxdiff}$ requirement 1106 and a minimum differential input voltage $V_{OUTmindiff}$ requirement 1108. For this particular input and output parameter data, the communication compatibility rule specifies that $V_{OUTmaxdiff} < V_{INmaxdiff}$ and $V_{OUTmindiff} > V_{INmindiff}$ for device compatibility.

As is well-known, some electronic devices are provided with the above-described common mode voltage specifications as opposed to basic minimum and maximum voltage levels described in relation to FIGS. 2–4, and vice versa. However, these voltage specifications can be translated so that only one or the other type of data need to be entered for analysis. Below are two tables, Tables 1 and 2, which provide an example translation of these data which is performed by the computer software or by the end-user prior to entry of the data.

TABLE 1

Translation of common mode voltage and $V_{OH}$ & $V_{OL}$ voltages

| Voltage Type | Equation | Result of Equation | Notes |
|---|---|---|---|
| $V_{OH}$ | $V_{CC}$ − 0.65 | 2.81 V | $V_{OHmax}$ = 2.81 V where $V_{CC}$ = 3.46 V |
| | $V_{CC}$ − 1.20 | 1.93 V | $V_{OHmin}$ = 1.93 V where $V_{CC}$ = 3.12 V |
| $V_{OL}$ | $V_{CC}$ − 1.50 | 1.96 V | $V_{OLmax}$ = 1.96 V where $V_{CC}$ = 3.46 V |
| | $V_{CC}$ − 1.90 | 1.19 V | $V_{OLmin}$ = 1.19 V where $V_{CC}$ = 3.13 V |
| ------ note: ------ | $V_{CC}$ − 3.3 | 0.00 V | $V_{CC}$ − 3.3 |

TABLE 2

Math for translation of common mode voltage and $V_{OH}$ & $V_{OL}$ voltages

| $V_{OH}$ | (2.81 V + 1.96 V)/2 = 2.38 V | Maximum Average Voltage Difference |
|---|---|---|
| $V_{OL}$ | (1.94 V + 1.19 V)/2 = 1.56 V | Minimum Average Voltage Difference |

Figure 12:
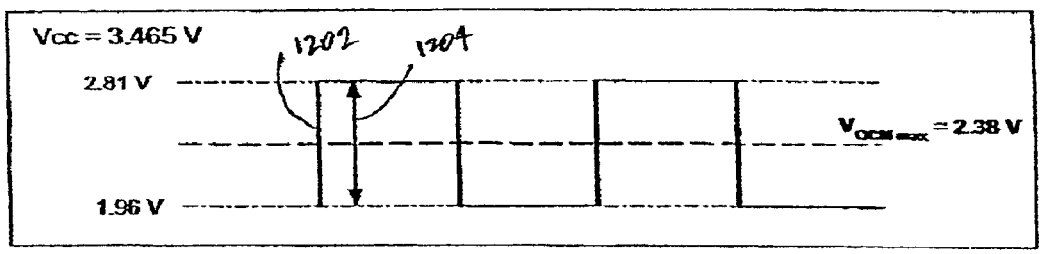
FIGS. 12 and 13 illustrate a relationship between common mode and the voltage levels described in relation in FIGS. 2–4.
Figure 13:
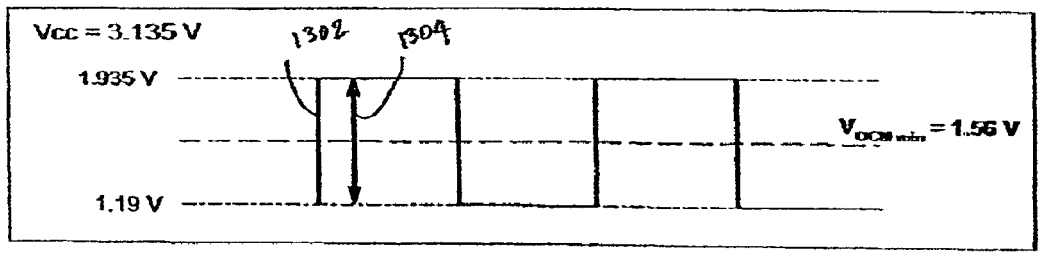

FIGS. 12 and 13 also illustrate the exemplary relationship between these voltage levels, showing a high signal 1202 (FIG. 12) having a minimum and minimum voltage swing 1204 and a low signal 1302 (FIG. 13) having a minimum and maximum voltage swing 1304.

For all of the methods described in relation to FIGS. 2–11, it is understood that some input and output parameter data may not be available for data entry. In this case, suitable "DON'T CARE" conditions may be utilized when no data are available in one or more data input fields. Here, the results provide an indication of device compatibility ignoring the rules associated with the DON'T CARE data while providing an additional indication that such unavailable data are ultimately necessary to complete the analysis.

Thus, as described herein, a computer-implemented method of quickly determining whether two or more electronic devices are communicatively compatible is advantageously provided. The method includes reading a plurality of input parameter data associated with a first electronic device and a plurality of output parameter data associated with a second electronic device; analyzing the pluralities of input and output parameter data by determining whether they comply with a plurality of communication compatibility rules; generating results from the analysis; and providing a visual display of the results. The displayed results identify which input and output parameter data do and do not comply with these rules, and thus whether and to what extent the devices are communicatively compatible.

The input and output parameter data may be or include any suitable communication specification data associated with the devices. For example, one basic compatibility requirement relates to minimum and maximum voltage levels of the devices. Here, the input parameter data of the first electronic device include a maximum high input voltage $V_{IHmax}$, a minimum high input voltage $V_{IHmin}$, a maximum low input voltage $V_{ILmax}$, and a minimum low input voltage $V_{ILmin}$; and the output parameter data of the second electronic device include a maximum high output voltage $V_{OHmax}$, a minimum high output voltage $V_{OHmin}$, a maximum low output voltage $V_{OLmax}$, and a minimum low output voltage $V_{OLmin}$. In this case, one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for device compatibility.

Another fundamental compatibility requirement relates to setup and hold times of the devices. Here, the input parameter data of the first electronic device include an input setup time $T_{INsetup}$ and an input hold time $T_{INhold}$, and the output parameter data of the second electronic device include an output setup time $T_{OUTsetup}$ and an output hold time $T_{OUThold}$. In this case, the communication compatibility rules specify that $T_{OUTsetup} > T_{INsetup}$ and $T_{OUThold} > T_{INhold}$ for device compatibility. A further compatibility requirement relates to clock rise and fall times of the devices. Here, the input parameter data include an input rise time $T_{INrise}$ and an input fall time $T_{INfall}$, the output parameter data of the first electronic device an output rise time $T_{OUTrise}$ and an output fall time $T_{OUTfall}$. In this case, the communication compatibility rules specify that $T_{OUTrise} < T_{INrise}$ and $T_{OUTfall} < T_{INfall}$ for device compatibility. Yet another compatibility requirement relates to clock duty cycles of the devices. The input parameter data of the first electronic device include an input clock duty cycle and the output parameter data of the second electronic device include an output clock duty cycle. In this case, the communication compatibility rules specify that the input clock duty cycle be closer to a 0/100 duty cycle than the output clock duty cycle, and the output clock duty cycle be closer to a 50/50 duty cycle than the input clock duty cycle. The last communication compatibility requirement described herein relates to common mode voltage levels of the devices. Here, the input parameter data of the first electronic device include a maximum differential input voltage $V_{INmaxdiff}$ and a minimum differential input voltage $V_{INmindiff}$, and the output parameter data of the second electronic device include a maximum differential output voltage $V_{OUTmaxdiff}$ and a minimum differential input voltage $V_{OUTmindiff}$. In this case, one of the communication compatibility rules specify that $V_{OUTmaxdiff} < V_{INmaxdiff}$ and $V_{OUTmindiff} > V_{INmindiff}$ for device compatibility.

As apparent, less time and money may be expended when designing a circuit or system since it takes less time and money to identify whether electronic devices are communicatively compatible. The "time to market" a circuit or system is typically a significant factor in the overall success of the circuit or system, and such time is advantageously reduced by use of the present invention. As described, a plurality of different types of input and output parameters may be considered together in the analysis for communicative compatibility.

It is to be understood that the above is merely a description of preferred embodiments of the invention and that various changes, alterations, and variations may be made without departing from the true spirit and scope of the invention as set for in the appended claims. For example, the input and output parameter data may involve any suitable DC or AC signal requirements, as well as any suitable analog or digital signal requirements. None of the terms or phrases in the specification and claims has been given any special particular meaning different from the plain language meaning to those skilled in the art, and therefore the specification is not to be used to define terms in an unduly narrow sense.

We claim:

1. A computer-implemented method of determining whether two or more electronic devices are communicatively compatible, the method comprising the acts of:

reading input parameter data associated with a first electronic device and output parameter data associated with a second electronic device;

analyzing the input and output parameter data by determining whether the input and output parameter data comply with one or more communication compatibility rules; and outputting results from the analysis;

wherein the input parameter data comprise an input setup time $T_{INsetup}$ and an input hold time $T_{INhold}$, the output parameter data comprise an output setup time $T_{OUTsetup}$ and an output hold time $T_{OUThold}$, and one of the communication compatibility rules specifies that $T_{OUTsetup} > T_{INsetup}$ and $T_{OUThold} > T_{INhold}$ for compatibility.

2. The method of claim 1, wherein the act of outputting results comprises the further act of identifying which input and output parameter data do not comply with a communication compatibility rule.

3. The method of claim 1, wherein the input parameter data comprise minimum and maximum input voltage levels and the output parameter data comprise minimum and maximum output voltage levels.

4. The method of claim 1, wherein the input parameter data comprise a maximum high input voltage $V_{IHmax}$, a minimum high input voltage $V_{IHmin}$, a maximum low input voltage $V_{ILmax}$, and a minimum low input voltage $V_{ILmin}$, the output parameter data comprise a maximum high output voltage $V_{OHmax}$, a minimum high output voltage $V_{OHmin}$, a maximum low output voltage $V_{OLmax}$, and a minimum low output voltage $V_{OLmin}$, and one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for compatibility.

5. The method of claim 1, wherein the input parameter data comprise an input setup time and an input hold time, and the output parameter data comprise an output setup time and an output hold time.

6. The method of claim 1, wherein the input parameter data comprise input rise and fall times and the output parameter data comprise output rise and fall times.

7. The method of claim 1, wherein the input parameter data comprise an input rise time $T_{INrise}$ and an input fall time $T_{INfall}$, the output parameter data comprise an output rise time $T_{OUTrise}$ and an output fall time $T_{OUTfall}$, and one of the communication compatibility rules specifies that $T_{OUTrise} < T_{INrise}$ and $T_{OUTfall} < T_{INfall}$ for compatibility.

8. The method of claim 1, wherein the input parameter data comprise an input clock duty cycle and the output parameter data comprise an output clock duty cycle.

9. The method of claim 1, wherein the input parameter data comprise an input clock duty cycle, the output parameter data comprise an output clock duty cycle, and one of the communication compatibility rules specifies that the input clock duty cycle be closer to a 0/100 duty cycle than the output clock duty cycle and the output clock duty cycle be closer to a 50/50 duty cycle than the input clock duty cycle.

10. The method of claim 1, wherein the input parameter data comprise a maximum differential input voltage and a minimum differential input voltage, and the output parameter data comprise a maximum differential output voltage and a minimum differential input voltage.

11. The method of claim 1, wherein the input parameter data comprise a maximum differential input voltage $V_{INmaxdiff}$ and a minimum differential input voltage $V_{INmindiff}$, the output parameter data comprise a maximum differential output voltage $V_{OUTmaxdiff}$ and a minimum differential input voltage $V_{OUTmindiff}$, and one of the communication compatibility rules specifies that $V_{OUTmaxdiff} < V_{INmaxdiff}$ and $V_{OUTmindiff} > V_{INmindiff}$ for compatibility.

12. The method of claim 1, wherein the computer-implemented method utilizes a personal computer (PC) or server computer and the act of outputting comprises visually displaying the results on a visual display.

13. A computer program product for determining whether two or more electronic devices are communicatively compatible, comprising:

a computer-readable medium; and computer-executable program code embodied in the computer-readable medium for reading input parameter data associated with a first electronic device and output parameter data associated with a second electronic device, analyzing the input and output parameter data by determining whether the input and output parameter data comply with one or more communication compatibility rules, and outputting results from the analysis;

wherein the computer-executable program code is for reading input parameter data comprising a maximum high input voltage $V_{IHmax}$, a minimum high input voltage $V_{IHmin}$, a maximum low input voltage $V_{ILmax}$, and a minimum low input voltage $V_{ILmin}$, output parameter data comprising a maximum high output voltage $V_{OHmax}$, a minimum high output voltage $V_{OHmin}$, a maximum low output voltage $V_{OLmax}$, and a minimum low output voltage $V_{OLmin}$, and one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for compatibility.

14. The computer program product of claim 13, wherein the computer-executable program code is for outputting results which includes identifying which input and output parameter data do not comply with a communication compatibility rule.

15. The computer program product of claim 13, wherein the computer-executable program code is for reading input parameter data comprising minimum and maximum input voltage levels and output parameter data comprising minimum and maximum output voltage levels.

16. The computer program product of claim 13, wherein the computer-executable program code is for reading input parameter data comprising an input setup time and an input hold time, and output parameter data comprising an output setup time and an output hold time.

17. The computer program product of claim 13, wherein the computer-executable program code is for reading input parameter data comprising an input setup time $T_{INsetup}$ and an input hold time $T_{INhold}$, and output parameter data comprising an output setup time $T_{OUTsetup}$ and an output hold time $T_{OUThold}$, and one of the communication compatibility rules specifies that $T_{OUTsetup} > T_{INsetup}$ and $T_{OUThold} > T_{INhold}$ for compatibility.

18. The computer program product of claim 13, wherein the computer-executable program code is for reading input parameter data comprising input rise and fall times and output parameter data comprising rise and fall times.

19. The computer program product of claim 13, wherein the computer-executable program code is for reading input parameter data comprising an input rise time $T_{INrise}$ and an input fall time $T_{INfall}$, output parameter data comprising an output rise time $T_{OUTrise}$ and an output fall time $T_{OUTfall}$, and one of the communication compatibility rules specifies that $T_{OUTrise} < T_{INrise}$ and $T_{OUTfall} < T_{INfall}$ for compatibility.

20. The computer program product of claim 13, wherein the computer-executable program code is for reading input parameter data comprising an input clock duty cycle and the output parameter data comprise an output clock duty cycle.

21. The computer program product of claim 13, wherein the computer-executable program code is for reading input parameter data comprising an input clock duty cycle, output parameter data comprising an output clock duty cycle, and one of the communication compatibility rules specifies that the input clock duty cycle be closer to a 0/100 duty cycle than the output clock duty cycle and the output clock duty cycle be closer to a 50/50 duty cycle than the input clock duty cycle.

22. The computer program product of claim 13, wherein the computer-executable program code is for reading input parameter data comprising a maximum differential input voltage and a minimum differential input voltage, and output parameter data comprising a maximum differential output voltage and a minimum differential input voltage.

23. The computer program product of claim 13, wherein the computer-executable program code is for reading input parameter data comprising a maximum differential input voltage $V_{INmaxdiff}$ and a minimum differential input voltage $V_{INmindiff}$, output parameter data comprising a maximum differential output voltage $V_{OUTmaxdiff}$ and a minimum differential input voltage $V_{OUTmindiff}$, and one of the communication compatibility rules specifies that $V_{OUTmaxdiff} < V_{INmaxdiff}$ and $V_{OUTmindiff} > V_{INmindiff}$ for compatibility.

24. The computer program product of claim 13, wherein the computer program product utilizes a personal computer (PC) or server computer having a visual display for visually displaying the results.

25. A computer-implemented method of determining whether two or more electronic devices are communicatively compatible, the method comprising the acts of:

reading a plurality of input parameter data associated with a first electronic device and a plurality of output parameter data associated with a second electronic device;

analyzing the pluralities of input and output parameter data by determining whether they comply with a plurality of communication compatibility rules;

generating results from the analysis; and providing a visual display of the results;

wherein the input parameter data comprise an input rise time $T_{INrise}$ and an input fall time $T_{INfall}$, the output parameter data comprise an output rise time $T_{OUTrise}$ and an output fall time $T_{OUTfall}$, and one of the communication compatibility rules specifies that $T_{OUTrise} < T_{INrise}$ and $T_{OUTfall} < T_{INfall}$ for compatibility.

26. The method of claim 25, wherein the plurality of input parameter data comprise two or more of the following data: a minimum input voltage level, a maximum input voltage level, an input setup time, an input hold time, an input rise time, an input fall time, an input clock duty cycle, a maximum differential input voltage; and the plurality of output parameter data comprise two or more of the following data: a minimum output voltage level, a maximum output voltage level, an output setup time, an output hold time, an output rise time, and output fall time, an output clock duty cycle, a minimum differential voltage level, and a maximum differential voltage level.

27. The method of claim 26, wherein the acts of generating and providing comprise the further acts of identifying which input and output parameter data do not comply with a communication compatibility rule.

28. The method of claim 25, wherein the act of reading comprises reading user-selected input data which include the pluralities of input and output parameter data.

29. The method of claim 25, wherein the input parameter data comprise a maximum high input voltage $V_{IHmax}$, a minimum high input voltage $V_{IHmin}$, a maximum low input voltage $V_{ILmax}$, and a minimum low input voltage $V_{ILmin}$, the output parameter data comprise a maximum high output voltage $V_{OHmax}$, a minimum high output voltage $V_{OHmin}$, a maximum low output voltage $V_{OLmax}$, and a minimum low output voltage $V_{OLmin}$, and one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for compatibility.

30. The method of claim 25, wherein the input parameter data comprise an input setup time $T_{INsetup}$ and an input hold time $T_{INhold}$, the output parameter data comprise an output setup time $T_{OUTsetup}$ and an output hold time $T_{OUThold}$, and one of the communication compatibility rules specifies that $T_{OUTsetup} > T_{INsetup}$, $T_{OUThold} > T_{INhold}$ for compatibility.

31. The method of claim 25, wherein the input parameter data comprise an input clock duty cycle, the output parameter data comprise an output clock duty cycle, and one of the communication compatibility rules specifies that the input clock duty cycle be closer to a 0/100 duty cycle than the output clock duty cycle and the output clock duty cycle be closer to a 50/50 duty cycle than the input clock duty cycle.

32. The method of claim 25, wherein the input parameter data comprise a maximum differential input voltage $V_{INmaxdiff}$ and a minimum differential input voltage $V_{INmindiff}$, the output parameter data comprise a maximum differential output voltage $V_{OUTmaxdiff}$ and a minimum differential input voltage $V_{OUTmindiff}$, and one of the communication compatibility rules specifies that $V_{OUTmaxdiff} < V_{INmaxdiff}$ and $V_{OUTmindiff} > V_{INmindiff}$ for compatibility.

33. A computer-implemented method of determining whether two or more electronic devices are communicatively compatible, the method comprising the acts of:

reading input parameter data associated with a first electronic device and output parameter data associated with a second electronic device;

analyzing the input and output parameter data by determining whether the input and output parameter data comply with one or more communication compatibility rules; and outputting results from the analysis;

wherein the input parameter data comprise a maximum high input voltage $V_{IHmax}$, a minimum high input voltage $V_{IHmin}$, a maximum low input voltage $V_{ILmax}$, and a minimum low input voltage $V_{ILmin}$, the output parameter data comprise a maximum high output voltage $V_{OHmax}$, a minimum high output voltage $V_{OHmin}$, a maximum low output voltage $V_{OLmax}$, and a minimum low output voltage $V_{OLmin}$, and one of the communication compatibility rules specifies that $V_{OHmax} \leq V_{IHmax}$, $V_{OHmin} \geq V_{IHmin}$, $V_{OLmax} \leq V_{ILmax}$, and $V_{OLmin} \geq V_{ILmin}$ for compatibility.

34. A computer-implemented method of determining whether two or more electronic devices are communicatively compatible, the method comprising the acts of:

reading input parameter data associated with a first electronic device and output parameter data associated with a second electronic device;

analyzing the input and output parameter data by determining whether the input and output parameter data comply with one or more communication compatibility rules; and outputting results from the analysis;

wherein the input parameter data comprise an input rise time $T_{INrise}$ and an input fall time $T_{INfall}$, the output parameter data comprise an output rise time $T_{OUTrise}$ and an output fall time $T_{OUTfall}$, and one of the communication compatibility rules specifies that $T_{OUTrise} < T_{INrise}$ and $T_{OUTfall} < T_{INfall}$ for compatibility.

35. A computer-implemented method of determining whether two or more electronic devices are communicatively compatible, the method comprising the acts of:

reading input parameter data associated with a first electronic device and output parameter data associated with a second electronic device;

analyzing the input and output parameter data by determining whether the input and output parameter data comply with one or more communication compatibility rules; and outputting results from the analysis;

wherein the input parameter data comprise an input clock duty cycle, the output parameter data comprise an output clock duty cycle, and one of the communication compatibility rules specifies that the input clock duty cycle be closer to a 0/100 duty cycle than the output clock duty cycle and the output clock duty cycle be closer to a 50/50 duty cycle than the input clock duty cycle.

36. A computer-implemented method of determining whether two or more electronic devices are communicatively compatible, the method comprising the acts of:

reading input parameter data associated with a first electronic device and output parameter data associated with a second electronic device;

analyzing the input and output parameter data by determining whether the input and output parameter data comply with one or more communication compatibility rules; and outputting results from the analysis;

wherein the input parameter data comprise a maximum differential input voltage $V_{INmaxdiff}$ and a minimum differential input voltage $V_{INmindiff}$, the output parameter data comprise a maximum differential output voltage $V_{OUTmaxdiff}$ and a minimum differential input voltage $V_{OUTmindiff}$, and one of the communication compatibility rules specifies that $V_{OUTmaxdiff} < V_{INmaxdiff}$ and $V_{OUTmindiff} > V_{INmindiff}$ for compatibility.

* * * * *